(12) United States Patent
Krithivasan et al.

(10) Patent No.: US 9,385,444 B2
(45) Date of Patent: Jul. 5, 2016

(54) LATERAL SLIDE PICK AND PLACE COVER FOR REDUCED BENT PINS IN LGA SOCKETS

(71) Applicant: Intel Corporation, Santa Clara, CA (US)

(72) Inventors: Vijaykumar Krithivasan, Chandler, AZ (US); Gaurav Chawla, San Jose, CA (US); Joshua D. Heppner, Chandler, AZ (US); Jeffory L. Smalley, East Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 260 days.

(21) Appl. No.: 14/132,924

(22) Filed: Dec. 18, 2013

(65) Prior Publication Data

US 2015/0171527 A1    Jun. 18, 2015

(51) Int. Cl.
*H01R 4/50* (2006.01)
*H01R 13/447* (2006.01)
*H05K 1/18* (2006.01)
*H01R 12/71* (2011.01)

(52) U.S. Cl.
CPC ............ *H01R 4/5066* (2013.01); *H01R 13/447* (2013.01); *H05K 1/181* (2013.01); *H01R 12/714* (2013.01); *H05K 2201/10325* (2013.01); *H05K 2201/10719* (2013.01); *Y10T 29/49204* (2015.01)

(58) Field of Classification Search
CPC ........... H01R 13/62916; H01R 4/5066; H01L 23/32; H05K 7/1404
See application file for complete search history.

(56) References Cited

U.S. PATENT DOCUMENTS

| | | | | |
|---|---|---|---|---|
| 4,868,714 A | * | 9/1989 | Banjo ................ | H01R 13/4534 361/617 |
| 5,530,376 A | * | 6/1996 | Lim ..................... | G01R 1/0483 324/750.05 |
| 6,667,888 B1 | * | 12/2003 | Chang ................. | H05K 5/0269 257/99 |
| 2003/0008570 A1 | * | 1/2003 | Murr ...................... | H01R 12/57 439/862 |
| 2003/0129859 A1 | * | 7/2003 | Ye ....................... | H01R 13/4534 439/64 |
| 2008/0032526 A1 | * | 2/2008 | Takahashi ............ | H01R 4/5066 439/81 |
| 2012/0200993 A1 | * | 8/2012 | Aoki ..................... | H05K 7/1007 361/679.02 |
| 2015/0171527 A1 | * | 6/2015 | Krithivasan .......... | H01R 13/447 439/135 |

* cited by examiner

*Primary Examiner* — James Harvey
(74) *Attorney, Agent, or Firm* — Schwegman Lundberg & Woessner, P.A.

(57) ABSTRACT

An apparatus comprises a socket for an integrated circuited (IC), wherein the socket includes a socket body that includes a plurality of land grid array contacts for contacting the IC, an alignment mechanism, and a locking mechanism, and a cover for the socket, wherein the cover is vertically alignable with the alignment mechanism of the socket body and laterally slidable over the grid array contacts upon alignment to engage the locking mechanism of the socket body.

17 Claims, 9 Drawing Sheets

LATERAL SLIDE PICK AND PLACE COVER FOR REDUCED BENT PINS IN LGA SOCKETS

TECHNICAL FIELD

Embodiments pertain to packaging of integrated circuits. Some embodiments relate to integrated circuit sockets.

BACKGROUND

Electronic systems often include integrated circuits (ICs) that are connected to a subassembly such as a substrate or motherboard. The ICs can be packaged and inserted into an IC socket that is mounted on the subassembly. An example of an IC socket is a land grid array socket or LGA socket. IC sockets can include a pick and place cover or cap. The pick and place cover is to protect the contacts of the IC socket from damage during shipping from the IC socket suppliers to the electronic system manufacturers. The pick and place cover also can provide a uniform surface that allows surface mount technology (SMT) equipment to pick up the IC socket from a shipping tray and place the IC socket on a motherboard or other printed circuit board (PCB).

There can be competing design constraints for a pick and place cover of an IC socket. During pick and place of the IC socket, it is desired that the pick and place cover have a high retention force to hold the socket body and cover together so that it does not fall off. Yet the pick and place cover needs to be removed (typically manually) at some point in the manufacturing process where it would be desired to have a low retention force to ease removal. Thus, there are general needs for devices, systems and methods that address the competing requirements for pick and place covers for IC sockets.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As explained previously herein, there can be competing design requirements for a pick and place cover for an IC socket during different phases of manufacturing. Additionally, an IC socket or socket/IC subassembly may have to be reworked. Accommodating rework on an IC socket can also add design requirements to a pick and place cover. Rework typically involves manual removal of the pick and place cover. The hands of the rework technician are placed close to the IC socket. Because removal of the pick and place cover by hand is not a uniform process, especially where the retention force is significant, there is a risk of damage to the contacts of the IC socket. Manual removal of the pick and place cover can involve unintended rotating or sliding that results in a pick and place cover not being removed perpendicularly as intended, which can result in damage to the LGA contacts, which can be fragile.

Figure 1:
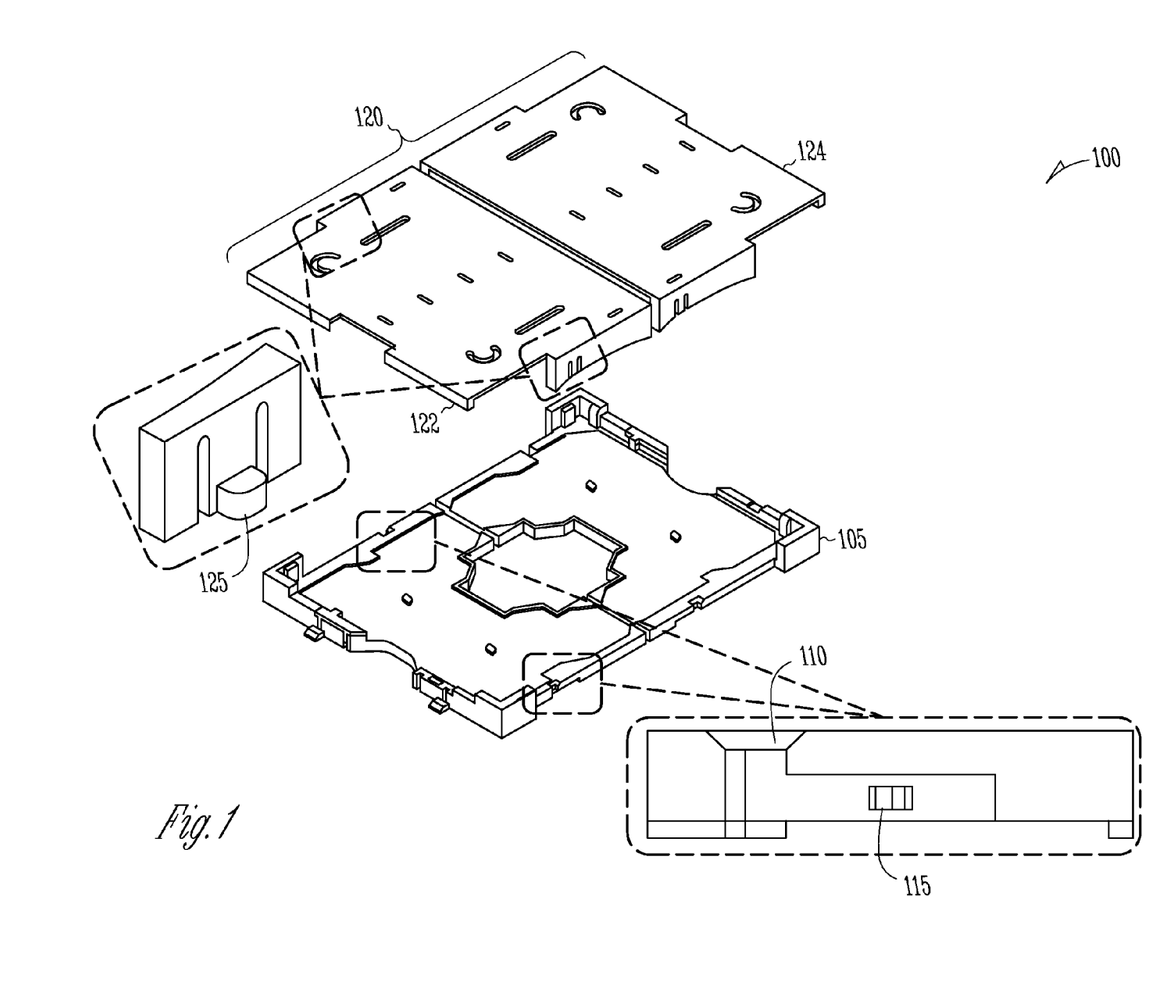
FIG. 1 illustrates portions of an example of a device that includes an IC socket in accordance with some embodiments.

FIG. 1 illustrates of portions of an example of a device that includes an IC socket 100. The IC socket includes a socket body 105 having a plurality of LGA contacts (not shown) extending upward from the bottom of the socket body 105 to form a contact field. The plurality of LGA contacts can be arranged to contact LGA contacts of an IC, such as an IC that includes a processor or other type of IC. The socket body 105 also includes an alignment mechanism 110 and a locking mechanism 115. The device includes a cover 120 for the socket, such as a pick and place cover. The cover 120 is vertically alignable with the alignment mechanism 110 of the socket body and laterally slidable over the grid array contacts upon alignment to engage the locking mechanism 115 of the socket body 105. As shown in the example of FIG. 1, the cover 120 for the socket can include a first cover portion 122 and a second cover portion 124.

Figure 2A:
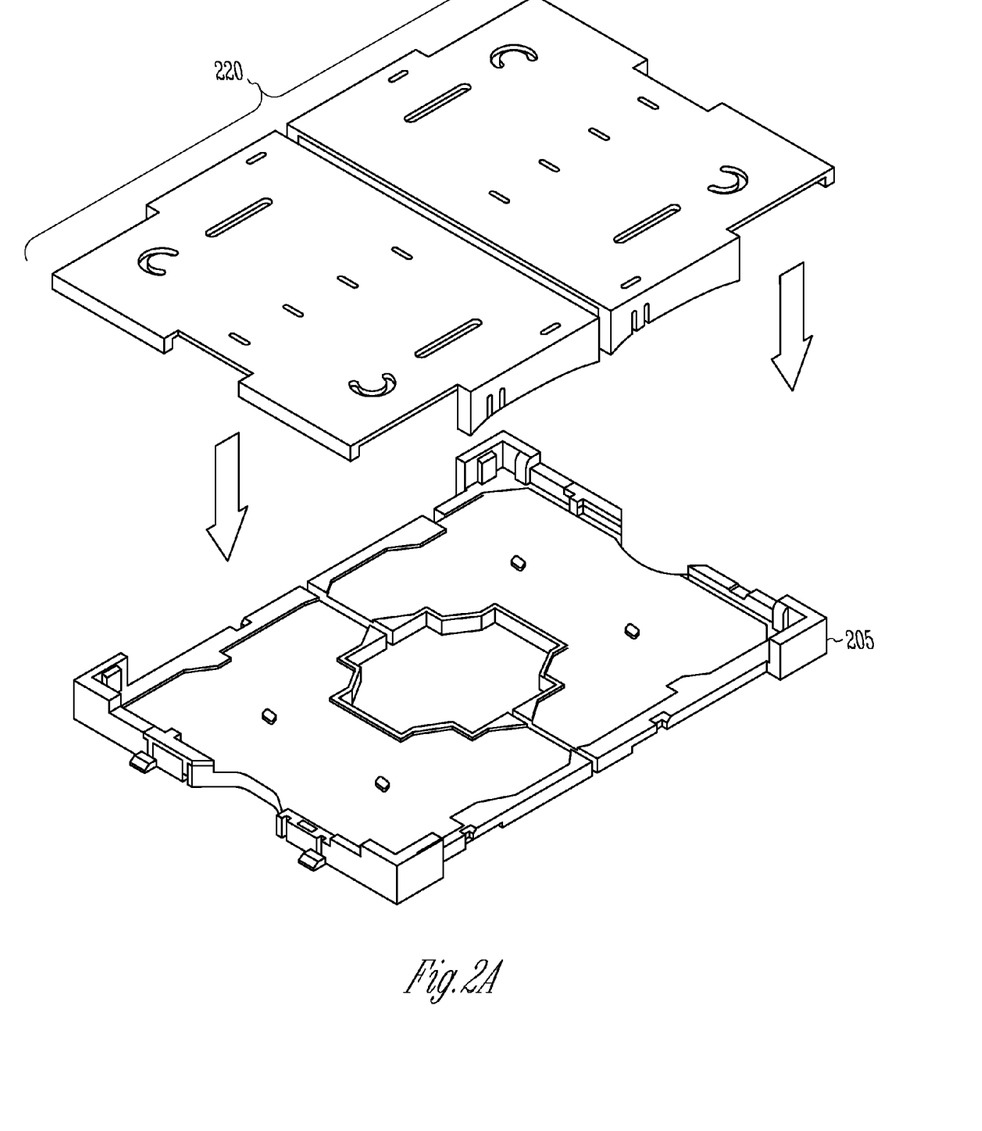
FIGS. 2A-2C illustrate an example of assembly of the cover and socket body in accordance with some embodiments.
Figure 2B:
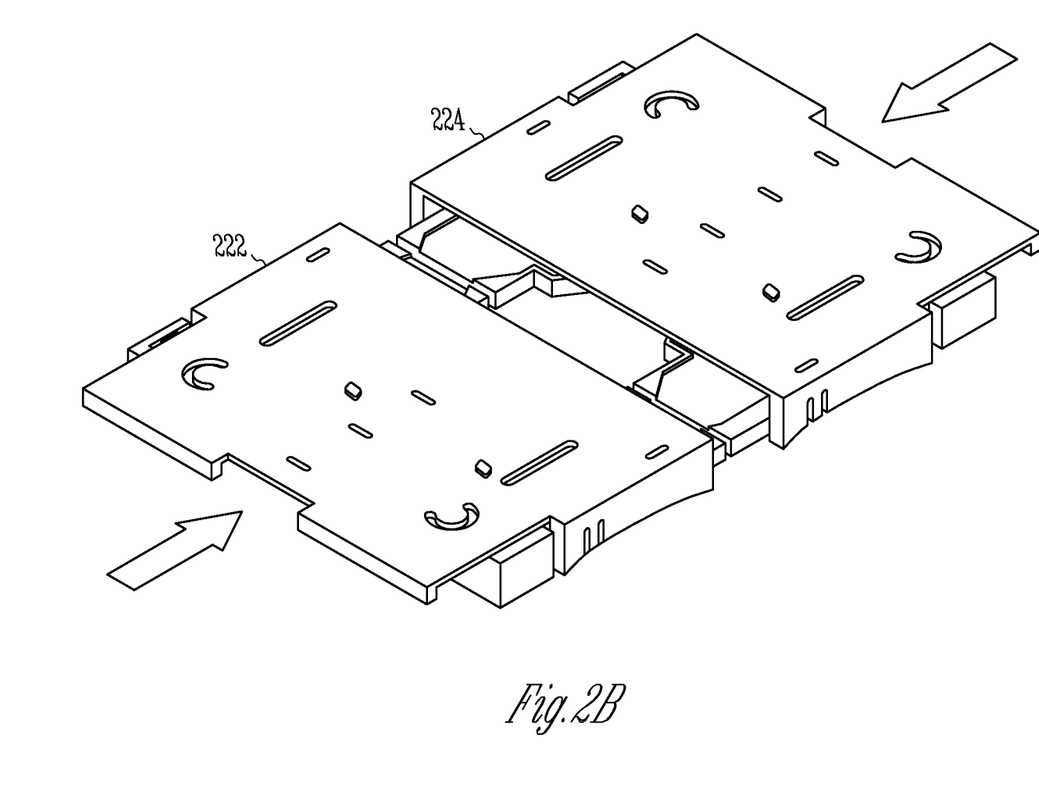
Figure 2C:
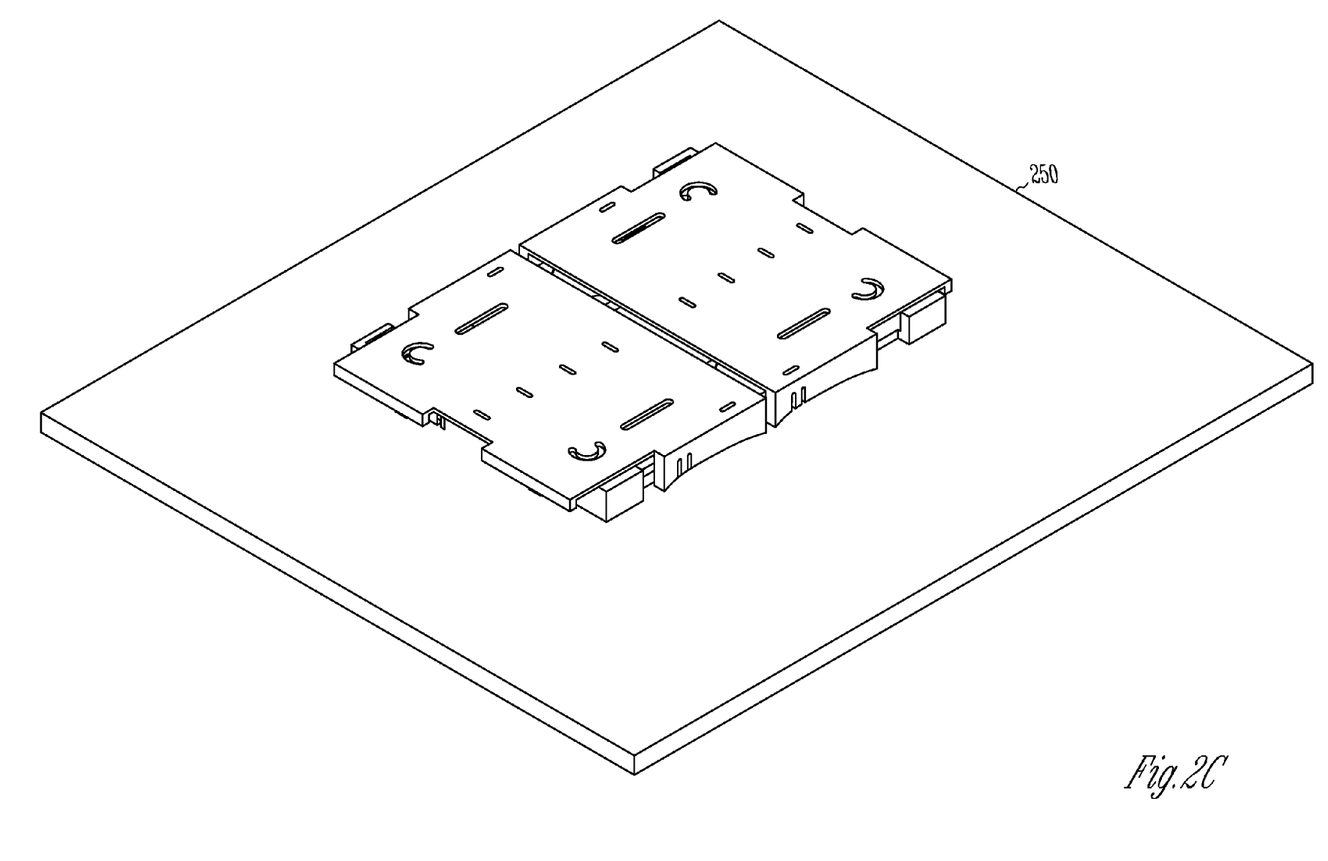

FIGS. 2A-2C illustrate an example of an assembly of the IC socket cover 220 and IC socket body 205. FIG. 2A shows that the first cover portion 222 and the second cover portion 224 are vertically alignable to a separated position. FIG. 2B shows that the first cover portion 222 and the second cover portion 224 are laterally slidable to a joined position to cover the land grid array contacts. FIG. 2C shows the covered IC socket mounted on a PCB 250.

Returning to FIG. 1, the socket body 105 can include a first alignment mechanism and a first locking mechanism for the first cover portion 122, and can include a second alignment mechanism and a second locking mechanism for the second cover portion 124. The locking mechanism of the socket body can include multiple locking features 125 arranged on opposing sides of the socket body 105. A cover portion (122, 124) can include openings on opposing sides of the cover portion that is configured (e.g., by shape, size, and position) to receive a locking feature 125 of the socket body 105. The locking feature 125 may have spring action for engaging and disengaging the opening. The locking feature 125 may provide a locking force (e.g., a spring action) in a direction away from the plurality of land grid array contacts. Because the locking force is orthogonal to the contact field, the separation of the cover from the socket may be uniform and predictable.

The locking features may be arranged asymmetrically on opposing sides of the socket body 105 and the openings may be arranged asymmetrically on opposing sides of a cover portion (122, 124). The asymmetric positioning can reduce the rotational degree of freedom of the cover and socket system which may be present during the sliding of the cover to a locking position.

Figure 3A:
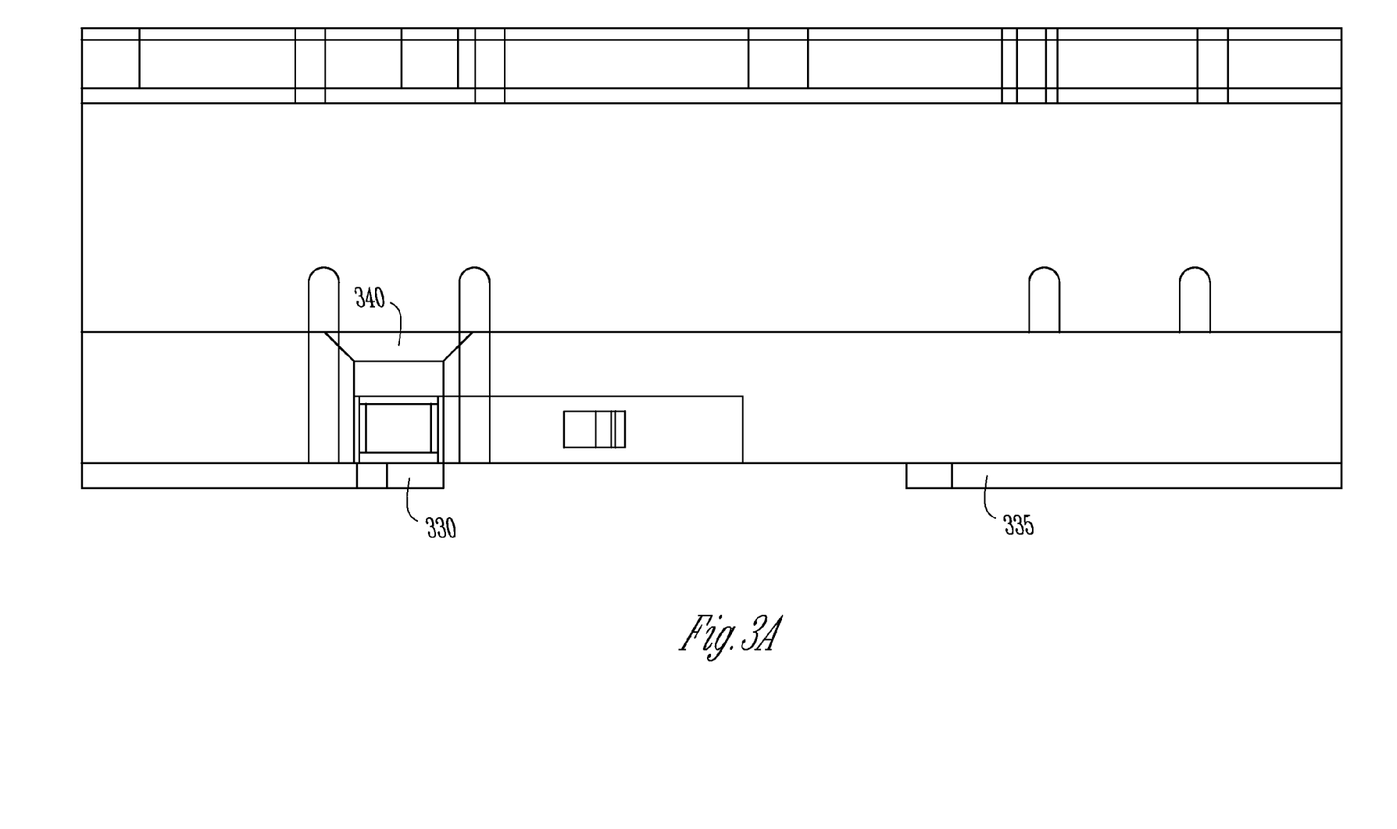
FIGS. 3A and 3B illustrate close up views of the side surface to show a detailed view of an IC socket in accordance with some embodiments.
Figure 3B:
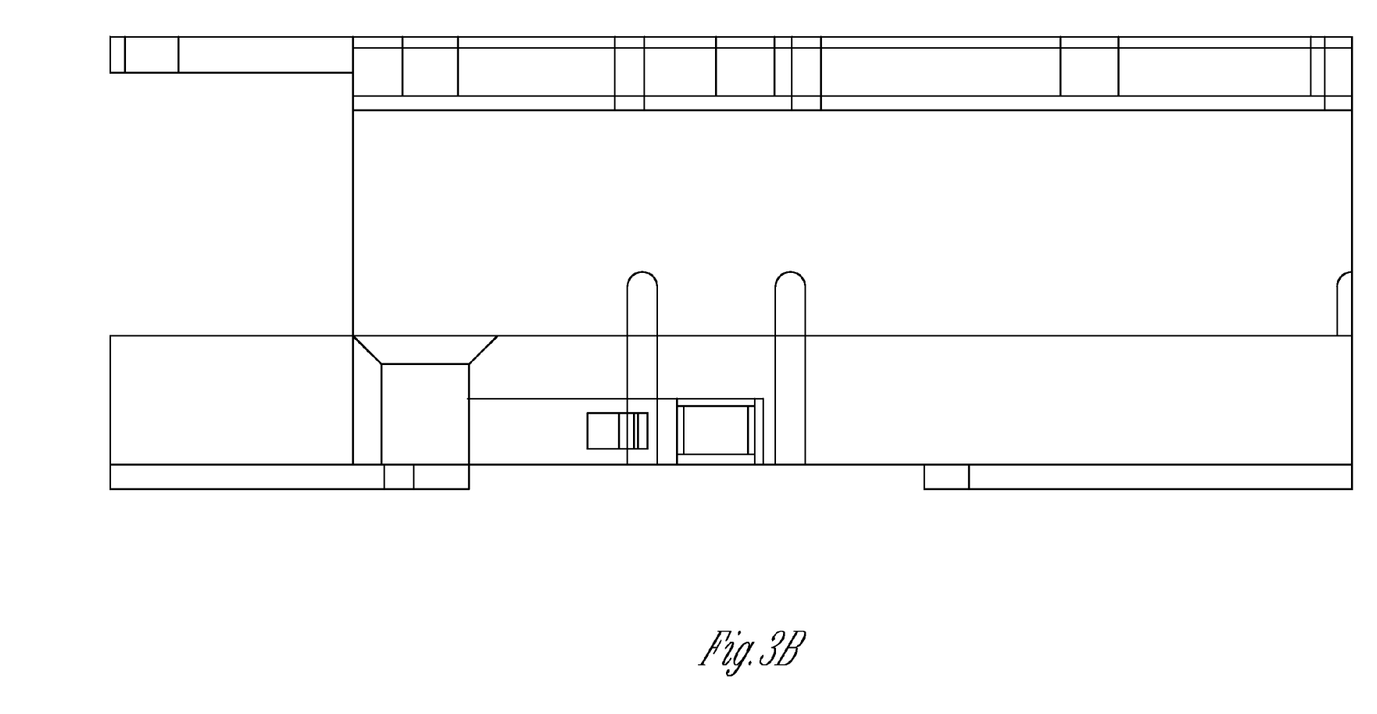

It can be seen from the examples in the Figures that a cover portion can include a top surface and a side surface. FIGS. 3A and 3B illustrate close up views of the side surface to show a detailed view of portions of examples of the alignment mechanism and locking mechanism. The alignment mechanism includes a plurality of alignment cut outs and a plurality of vertical stops to engage a cover portion. Alignment cutouts and vertical stops can be arranged on opposing sides of a cover portion. FIG. 3A shows an example of a vertical stop 330 and an alignment cutout 340 on one side surface of a cover portion. Vertical stops can be included in a plurality of slide rails 335 arranged to laterally guide the cover portion to the locking mechanism. The side surfaces of the cover portions engage the alignment cutouts 340 as the cover portion is lowered vertically until it hits vertical stop of the slide rail. The cover may then be slid laterally with the slide rail as a guide until the cover reaches an engaged position. FIG. 3B shows a detail of a cover portion engaged with the socket body. The latching feature may have a spring action to provide tactile feedback when the engaged position is reached to facilitate manual attachment of the covers.

Figure 4:
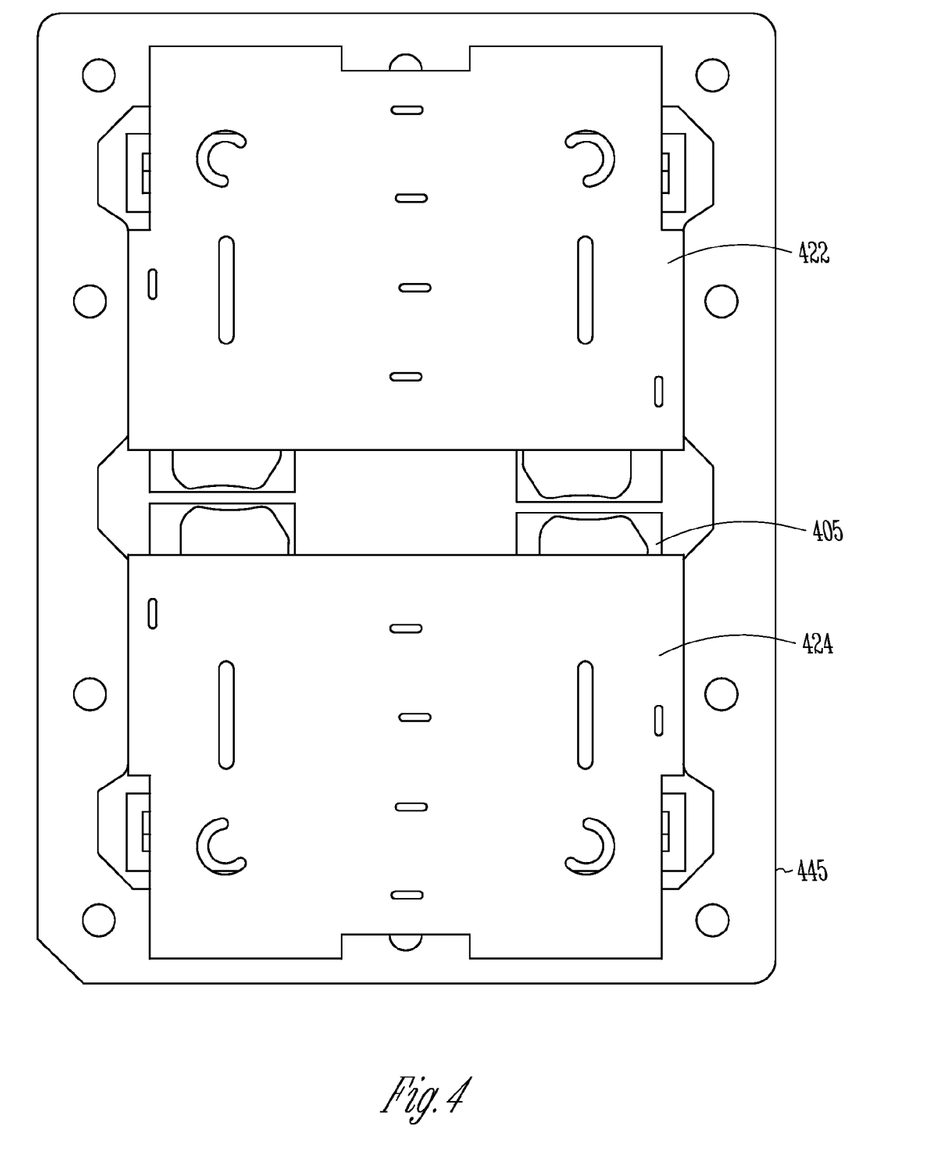
FIG. 4 illustrates an example of an IC socket, an IC socket cover and a bolster plate in accordance with some embodiments.

FIG. 4 illustrates an example of an IC socket 405, an IC socket cover (422, 424) and a bolster plate 445. The bolster plate 445 can be included in the IC socket assembly to facilitate loading by a pick and place machine during manufacturing. The IC socket cover is well within the knock out zones of the bolster plate and therefore the cover can engage the IC socket even in the presence of the bolster plate 445. The IC socket cover can be reusable and can eliminate the need for additional covers (e.g., a dust cover).

The examples of a pick and place IC socket cover described herein may mitigate the occurrence of bent pins or damaged contacts because the sliding mechanism of the covers is positioned away from the contact field of the sockets. Additionally, the pick and place cover engages the IC socket in a direction that is orthogonal to the contact field and release of the covers is also orthogonal to the contact field.

The IC socket can be included in a higher level electronic assembly or subassembly. The IC socket can be mounted on a printed circuit board (PCB) such as a motherboard. The IC socket can be mounted to the PCB with a pick and place IC socket cover and the cover can be later removed. An IC (e.g., a processor IC, a memory IC, or application specific IC) can be added to the IC socket when the cover is removed from the IC socket. Other examples of an IC include a communication circuit for use in wireless devices like mobile telephones, personal data assistants, portable computers, two-way radios, and similar electronic systems. The IC can perform any other type of function.

Figure 5:
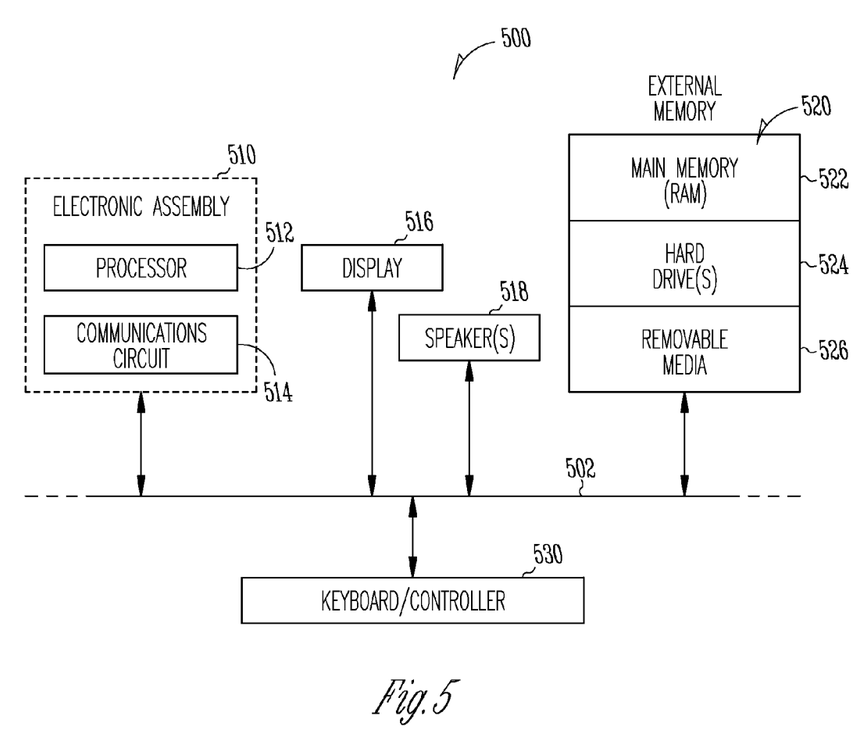
FIG. 5 is a block diagram of an example of an electronic system.

An example of an electronic system using one or more IC sockets as described in the present disclosure is included to show an example of a higher level device application for the present invention. FIG. 5 is a block diagram of an example of an electronic system 500 incorporating at least one IC socket and in accordance with at least one embodiment of the invention. Electronic system 500 is merely one example in which embodiments of the present invention can be used. Examples of electronic systems 500 include, but are not limited to personal computers, tablet computers, mobile telephones, game devices, etc. In this example, electronic system 500 comprises a data processing system that includes a system bus 502 to couple the various components of the system. System bus 502 provides communications links among the various components of the electronic system 500 and can be implemented as a single bus, as a combination of busses, or in any other suitable manner.

An electronic assembly 510 can be coupled to system bus 502. The electronic assembly 510 can include any circuit or combination of circuits. In one embodiment, the electronic assembly 510 includes a processor 512 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 510 are a custom circuit, an application-specific integrated circuit (ASIC), or the like, such as, for example, one or more circuits (such as a communications circuit 514) for use in wireless devices like mobile telephones, personal data assistants, portable computers, two-way radios, and similar electronic systems. The IC can perform any other type of function.

The electronic system 500 can also include an external memory 520, which in turn can include one or more memory elements suitable to the particular application, such as a main memory 522 in the form of random access memory (RAM), one or more hard drives 524, and/or one or more drives that handle removable media 526 such as compact disks (CD), flash memory cards, digital video disk (DVD), and the like.

The electronic system 500 can also include a display device 516, one or more speakers 518, and a keyboard and/or controller 530, which can include a mouse, trackball, touch screen, voice-recognition device, or any other device that permits a system user to input information into and receive information from the electronic system 500.

Figure 6:
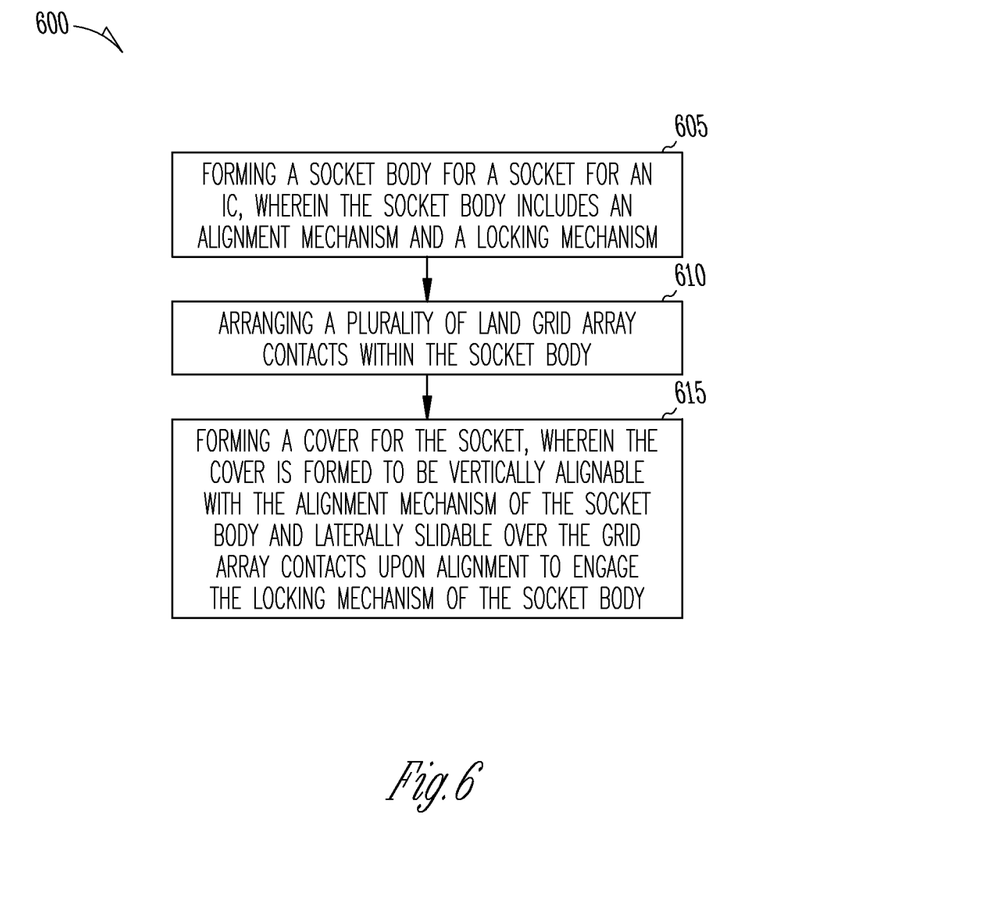
FIG. 6 shows a flow diagram of an example of a method of making an IC socket in accordance with some embodiments.

FIG. 6 shows a flow diagram of an example of a method 600 of making an IC socket. At block 605, a socket body is formed. The socket body is included in a socket for an IC and includes an alignment mechanism and a locking mechanism. At block 610, a plurality of LGA contacts are arranged within the socket body. The LGA contacts can be pins extending upward from a bottom surface of the socket body.

At block 615, a cover for the socket is formed. The cover can be vertically alignable with the alignment mechanism of the socket body and laterally slidable over the LGA contacts upon alignment to engage the locking mechanism of the socket body. The cover can be formed as a first cover portion and a second cover portion. Each cover portion can be formed to be vertically alignable. Cutouts can be formed on the socket body and the cover portions can include a feature to engage a cutout portion of the socket body to facilitate alignment. Forming the cover can include forming features to engage cutouts of the socket body and arranging the features and cutouts asymmetrically on the socket body. The features can be latching features to engage the locking mechanism. In certain examples, each of the cover portions includes two latching features. Forming the socket body can include forming vertical stops on the socket body to provide tactile feedback of when the cover portions are properly aligned.

The vertical alignment can include the cover portions in a separated position. Forming the socket body can include forming multiple slide rails arranged to laterally guide the cover portions to a joined position to cover the LGA contacts and to engage the locking mechanism of the socket body.

Additional Notes and Examples

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

To better illustrate the methods and apparatuses disclosed herein, a non-limiting list of examples is provided below.

Example 1 can include subject matter (such as an apparatus or assembly) including a socket for an integrated circuited (IC) and a cover for the socket. The socket can include a socket body that includes a plurality of land grid array contacts for contacting the IC, an alignment mechanism, and a locking mechanism. The cover can be vertically alignable with the alignment mechanism of the socket body and laterally slidable over the land grid array contacts upon alignment to engage the locking mechanism of the socket body.

In Example 2, the subject matter of Example 1 optionally includes a cover having a first cover portion and a second cover portion. The socket body optionally includes a first alignment mechanism and a first locking mechanism for the first cover portion, and includes a second alignment mechanism and a second locking mechanism for the second cover portion.

In Example 3, the subject matter of Example 2 optionally includes a first cover portion and a second cover portion that are vertically alignable to a separated position and laterally slidable to a joined position to cover the plurality of land grid array contacts.

In Example 4, the subject matter of one or any combination of Examples 2 and 3 optionally includes an alignment mechanism having a plurality of alignment cut outs and a plurality of vertical stops to engage a cover portion, and the vertical stops are optionally included in a plurality of slide rails arranged to laterally guide the cover portion to the locking mechanism.

In Example 5, the subject matter of Example 4 optionally includes a cover portion having a top surface and side surfaces, and the side surfaces are optionally arranged to engage the plurality of alignment cut outs and the plurality of slide rails.

In Example 6, the subject matter of one or any combination of Examples 2-5 optionally includes a locking mechanism of the socket body having locking features arranged on opposing sides of the socket body. A cover portion can optionally include openings on opposing sides of the cover portion, and an opening can be configured to receive a locking feature of the socket body.

In Example 7, the subject matter of Example 6 can optionally include locking features arranged asymmetrically on opposing sides of the socket body and the openings can be optionally be arranged asymmetrically on opposing sides of a cover portion.

In Example 8, the subject matter of one or any combination of Examples 6 and 7 can optionally include a locking feature that provides a locking force in a direction away from the plurality of land grid array contacts.

In Example 9, the subject matter of one or any combination of Examples 1-8 can optionally include a plurality of land grid array contacts arranged to contact a plurality of land grid array contacts of an IC having a processor.

Example 10 can include subject matter (such as a method or means for performing acts), or can optionally be combined with any of Example 1-9 to include subject matter, including forming a socket body for a socket for an IC, arranging a plurality of land grid array contacts within the socket body, and forming a cover for the socket. The socket body includes an alignment mechanism and a locking mechanism, and the cover is formed to be vertically alignable with the alignment mechanism of the socket body and laterally slidable over the land grid array contacts upon alignment to engage the locking mechanism of the socket body.

In Example 11, the subject matter of Example 10 optionally includes forming a first cover portion and a second cover portion. Forming a socket body can optionally include forming a first alignment mechanism and a first locking mechanism for the first cover portion, and forming a second alignment mechanism and a second locking feature for the second cover portion.

In Example 12, the subject matter of Example 11 can optionally include forming at least first and second alignment cut outs and at least first and second vertical stops to engage a cover portion, and at least first and second slide rails arranged to laterally guide a cover portion toward the center of the socket body to the locking mechanism of the socket body.

In Example 13, the subject matter of Example 12 optionally includes forming a cover portion to include a top surface and side surfaces. The side surfaces can optionally be arranged to engage the alignment cut outs and the slide rails.

In Example 14, the subject matter of one or any combination of Examples 11-13 optionally includes forming locking features arranged asymmetrically on opposing sides of the socket body, and forming openings arranged asymmetrically on opposing sides of a cover portion to receive the locking features.

Example 15 can include subject matter (such as an electronic assembly), or can optionally be combined with any of Examples 1-14 to include subject matter, including a printed circuit (PCB), at least one socket for an integrated circuited (IC) mounted on the PCB, and a cover for the socket. The socket can optionally include a socket body that includes a plurality of land grid array contacts for contacting the IC, an alignment mechanism, and a locking feature. The cover can optionally be vertically alignable with the alignment mechanism of the socket body and laterally slidable over the land grid array contacts upon alignment to engage the locking mechanism of the socket body.

In Example 16, the subject matter of Example 15 can optionally include a cover having a first cover portion and a second cover portion. The socket body can optionally include a first alignment mechanism and a first locking mechanism for the first cover portion, and a second alignment mechanism and a second locking feature for the second cover portion.

In Example 17, the subject matter of Example 16 optionally includes a first cover portion and a second cover portion that are vertically alignable to a separated position and laterally slidable to a joined position to cover the plurality of land grid array contacts.

In Example 18, the subject matter of one or any combination of Examples 16 and 17 optionally includes a plurality of alignment cut outs and a plurality of vertical stops to engage a cover portion. The vertical stops can be optionally included in a plurality of slide rails arranged to laterally guide the cover portion to the locking mechanism.

In Example 19, the subject matter of one or any combination of Examples 16-18 optionally includes a locking mechanism of the socket body having locking features arranged on opposing sides of the socket body. A cover portion optionally includes openings on opposing sides of the cover portion, and an opening is configured to receive a locking feature of the socket body.

In Example 20, the subject matter of one or any combination of Examples 15-19 optionally includes a PCB that is a motherboard for an electronic system.

Each of these non-limiting examples can stand on its own, or can be combined in various permutations or combinations with one or more of the other examples.

What is claimed is:

1. An electronic assembly comprising:
   a printed circuit (PCB);
   at least one socket for an integrated circuited (IC) mounted on the PCB, wherein the socket includes a socket body that includes a plurality of land grid array contacts for contacting the IC, an alignment mechanism, and a locking feature; and a cover for the socket, wherein the cover is vertically alignable with the alignment mechanism of the socket body and laterally slidable over the land grid array contacts upon alignment to engage the locking mechanism of the socket body, wherein the cover includes a first cover portion and a second cover portion, and wherein the socket body includes a first alignment mechanism and a first locking mechanism for the first cover portion, and includes a second alignment mechanism and a second locking feature for the second cover portion.

2. An apparatus comprising:

a socket for an integrated circuited (IC), wherein the socket includes a socket body that includes a plurality of land grid array contacts for contacting the IC, an alignment mechanism, and a locking mechanism; and a cover for the socket, wherein the cover is vertically alignable with the alignment mechanism of the socket body and laterally slidable over the land grid array contacts upon alignment to engage the locking mechanism of the socket body, wherein the cover includes a first cover portion and a second cover portion, wherein the socket body includes a first alignment mechanism and a first locking mechanism for the first cover portion, and includes a second alignment mechanism and a second locking mechanism for the second cover portion.

3. The apparatus of claim 2, wherein the first cover portion and the second cover portion are vertically alignable to a separated position and laterally slidable to a joined position to cover the plurality of land grid array contacts.

4. The apparatus of claim 2, wherein the alignment mechanism includes a plurality of alignment cut outs and a plurality of vertical stops to engage a cover portion, and wherein the vertical stops are included in a plurality of slide rails arranged to laterally guide the cover portion to the locking mechanism.

5. The apparatus of claim 4, wherein a cover portion includes a top surface and side surfaces, wherein the side surfaces are arranged to engage the plurality of alignment cut outs and the plurality of slide rails.

6. The apparatus of claim 2, wherein the locking mechanism of the socket body includes locking features arranged on opposing sides of the socket body, wherein a cover portion includes openings on opposing sides of the cover portion, wherein an opening is configured to receive a locking feature of the socket body.

7. The apparatus of claim 6, wherein the locking features are arranged asymmetrically on opposing sides of the socket body and the openings are arranged asymmetrically on opposing sides of a cover portion.

8. The apparatus of claim 6, wherein a locking feature provides a locking force in a direction away from the plurality of land grid array contacts.

9. The apparatus of claim 2, wherein the plurality of land grid array contacts are arranged to contact a plurality of land grid array contacts of an IC having a processor.

10. The electronic assembly of claim 1, wherein the PCB is a motherboard for an electronic system.

11. A method comprising:

forming a socket body for a socket for an IC, wherein the socket body includes an alignment mechanism and a locking mechanism;

arranging a plurality of land grid array contacts within the socket body; and forming a cover for the socket, wherein the cover is formed to be vertically alignable with the alignment mechanism of the socket body and laterally slidable over the land grid array contacts upon alignment to engage the locking mechanism of the socket body, wherein forming a cover for the socket includes forming a first cover portion and a second cover portion, and wherein forming a socket body includes forming a first alignment mechanism and a first locking mechanism for the first cover portion, and includes forming a second alignment mechanism and a second locking feature for the second cover portion.

12. The method of claim 11, wherein forming an alignment mechanism includes forming at least first and second alignment cut outs and at least first and second vertical stops to engage a cover portion, and wherein forming a socket body further includes forming at least first and second slide rails arranged to laterally guide a cover portion toward the center of the socket body to the locking mechanism of the socket body.

13. The method of claim 12, wherein forming the first and second cover portions includes forming a cover portion to include a top surface and side surfaces, wherein the side surfaces are arranged to engage the alignment cut outs and the slide rails.

14. The method of claim 11, wherein forming a locking mechanism includes forming locking features arranged asymmetrically on opposing sides of the socket body, wherein forming a cover portion includes forming openings arranged asymmetrically on opposing sides of the cover portion to receive the locking features.

15. The electronic assembly of claim 1, wherein the locking mechanism of the socket body includes locking features arranged on opposing sides of the socket body, wherein a cover portion includes openings on opposing sides of the cover portion, wherein an opening is configured to receive a locking feature of the socket body.

16. The electronic assembly of claim 1, wherein an alignment mechanism includes a plurality of alignment cut outs and a plurality of vertical stops to engage a cover portion, and wherein the vertical stops are included in a plurality of slide rails arranged to laterally guide the cover portion to the locking mechanism.

17. The electronic assembly of claim 1, wherein the first cover portion and the second cover portion are vertically alignable to a separated position and laterally slidable to a joined position to cover the plurality of land grid array contacts.

* * * * *